United States Patent
Lutkiewicz et al.

(10) Patent No.: US 6,823,586 B2
(45) Date of Patent: Nov. 30, 2004

(54) METHOD OF MOUNTING A BUTTERFLY PACKAGE ON A PCB

(75) Inventors: Eric Lutkiewicz, Ottawa (CA); Bob Van Leeuwen, Ottawa (CA); Peter J. KleinBeernink, Carp (CA)

(73) Assignee: Meriton Networks Inc., Ottawa (CA)

( * ) Notice: Subject to any disclaimer, the term of this patent is extended or adjusted under 35 U.S.C. 154(b) by 0 days.

(21) Appl. No.: 10/445,343

(22) Filed: May 27, 2003

(65) Prior Publication Data

US 2003/0223203 A1 Dec. 4, 2003

Related U.S. Application Data

(60) Provisional application No. 60/383,611, filed on May 29, 2002.

(51) Int. Cl.[7] ............................ H05K 13/00; H05K 7/10
(52) U.S. Cl. ............................ 29/854; 29/832; 29/842; 29/845; 29/840; 361/760
(58) Field of Search ....................... 29/832, 842, 854, 29/845, 840; 361/760; 228/179.1; 257/718, 719

(56) References Cited

U.S. PATENT DOCUMENTS

| | | | | |
|---|---|---|---|---|
| 4,812,949 A | * | 3/1989 | Fontan et al. ............... 361/719 |
| 5,117,281 A | * | 5/1992 | Katsuraoka .................. 257/722 |
| 5,149,958 A | * | 9/1992 | Hallenbeck et al. ......... 250/216 |
| 5,184,211 A | * | 2/1993 | Fox ............................. 257/706 |
| 5,410,451 A | * | 4/1995 | Hawthorne et al. .......... 361/760 |
| 6,035,523 A | * | 3/2000 | McNeil et al. ................ 29/832 |

OTHER PUBLICATIONS

Bailey, Chris, "Modelling the effect of temperature on product reliability", 19th IEEE Semi–Therm Sypmosium, 2003.

* cited by examiner

Primary Examiner—Carl J. Arbes
Assistant Examiner—Tai Van Nguyen
(74) Attorney, Agent, or Firm—Marks & Clerk

(57) ABSTRACT

A method of mounting a package such as a Butterfly package to a printed circuit board in order to make efficient use of the board's real estate is described. According to a preferred embodiment of the invention the package is mounted on its side such that leads of one side (now the bottom) of the butterfly package are connected either directly to surface mount pads on the PCB or project through and connected to through-holes in the PCB. The leads on the other side (now top) are connected to a flex circuit or ribbon cable. A heatsink can be attached to the package without impinging significantly on the PCB layout.

15 Claims, 4 Drawing Sheets

METHOD OF MOUNTING A BUTTERFLY PACKAGE ON A PCB

This application claims benefit under 35 USC 119(e) of U.S. Provisional Application No. 60/383,611 filed May 29, 2002.

FIELD OF THE INVENTION

This invention relates to equipment design and more particularly to a method of mounting an optical or electrical package, such as a Butterfly package, on a substrate such as a printed circuit board.

BACKGROUND

As the demand for data bandwidth in communication systems increases, equipment designers and engineers must find ways of increasing the packaging density of the printed circuit boards (PCBs) to achieve more data bandwidth in less space at lower cost. The Butterfly package is a telecommunications industry standard package for lasers, photodiodes, power detectors, etc. The typical method of mounting a butterfly package requires machining a rectangular hole in the Printed Circuit Board (PCB), mounting or attacking the Butterfly package on the PCB, soldering the leads to the edge-launched pads, and mounting any required heatsinks on the secondary side of the PCB. The standard mounting method of a Butterfly package is problematic in several ways:

A machined or punched cut-out increases the manufacturing cost of the PCB and reduces the available PCB space for routing signal lines and placing components.

Typically, there is more volume available for heatsinks on the primary side of the PCB than on the secondary side. Increasing volume on the secondary side will necessitate increasing the inter-card spacing in a system and, consequently, reduce the overall system density.

The typical horizontal mounting of the Butterfly package, i.e. with leads extending parallel to the plane of the PCB, takes up significant board area. This standard mounting orientation reduces the PCB density and therefore the system density.

In a Butterfly package for an optical application the optical fiber associated with optical components in the package is inherently fragile. The transmission characteristics of an optical signal carried by the fiber can be changed or damaged by what is known as "overbending", i.e. bending a fiber in too small of a radius. For most Butterfly packages, the optical fiber is either in the same plane, or very close to being in the same plane as the leads extending from the package. For Butterfly packages mounted using a cut-out, as described above, an extension of the cut-out is usually necessary to allow the fiber to be routed without overbending it. This extension of the cut-out further reduces the PCB packaging density.

An alternate method of mounting the Butterfly package involves placing the package on the primary side of the board and forming or bending the leads so that they are mounted on a surface mount pad or project through and are attached to holes in the board. The long lead length required to form the leads at 90 degrees increases the series inductance of the leads so much that the component becomes unusable at high frequencies.

While Butterfly packages are typically used for packaging optical components they can also be used to package electronic circuitry. Mounting a Butterfly package will involve many of the same problems listed above regardless of what the package itself is housing. The invention is not limited to the mounting of Butterfly packages housing optical components, but includes Butterfly packages housing an electronic circuit or electro-optical circuits.

SUMMARY OF THE INVENTION

The invention concerns a novel method of mounting a Butterfly package on a PCB. Rather than mounting the package in the standard method, requiring a cut-out in the PCB, low component density, and secondary side mounted heatsinks, the invention introduces a mounting technique wherein the Butterfly package is positioned on its side. This side mounting eliminates the need for a PCB cut-out, allows for a primary side mounted heatsink, and increases the PCB density and volumetric packaging efficiency.

The connections on the now "bottom side" of the Butterfly package are made as through holes in the PCB, while the leads at the now "top side" of the package are connected to the PCB via a flex circuit or ribbon connection. Depending on the application, the connections to the through-hole can be designed to support DC currents or high frequency signals. Similarly the flex circuit can be specifically designed to carry anything from DC currents to high frequency signals.

Therefore, in accordance with the present invention there is provide a method of mounting a package to a printed circuit board (PCB), the package having a body with a plurality of leads extending outwardly from opposed first and second sides of the body, the method comprising: locating the package on the PCB such that leads on the first side of the body are facing the PCB; connecting the leads on the first side to connection points on the PCB; and connecting the leads on the second side of the body to a flexible ribbon connector.

DETAILED DESCRIPTION OF THE INVENTION

Figure 1A:
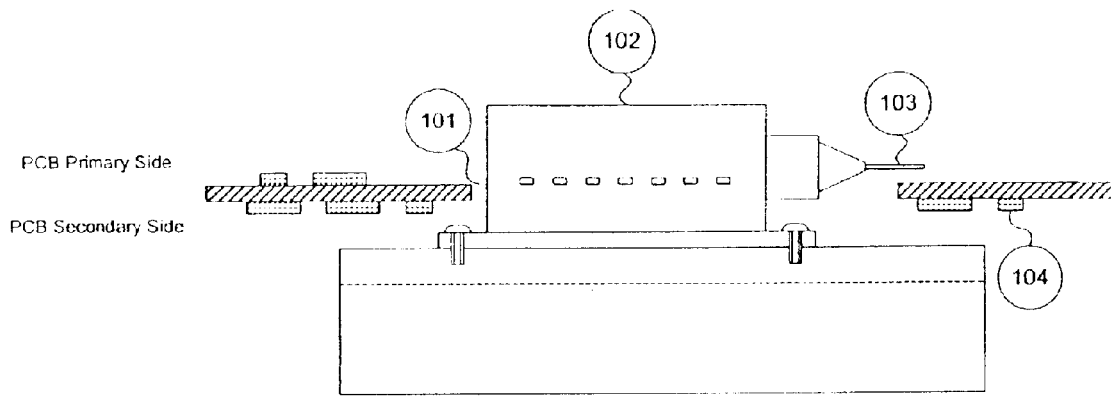
FIG. 1A is a side view of a prior art mounting technique with a PCB cut-out.
Figure 1B:
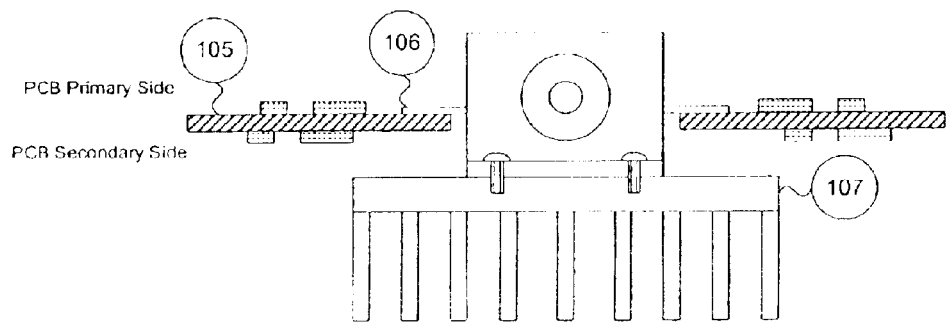
FIG. 1B is an end view of the technique shown in FIG. 1A

Refer to FIGS. 1A and 1B for a conventional mounting of the Butterfly package 102 in which an opening 101 is cut in the PCB 105 to make room for the Package 102. In the case of an optical package, additional clearance must be taken for an optical fiber 103 to exit the Package 102 and not be "overbent". Any required heatsinking 107 will typically be mounted on the secondary side of the PCB 105. The leads of the package 106 are mounted on surface mount pads on the PCB 105. Significant area for the mounting surface to mount components 104 is lost due to the Butterfly package 102, surface mount leads 106, the cutout 101, and the optical fiber 103.

Figure 2A:
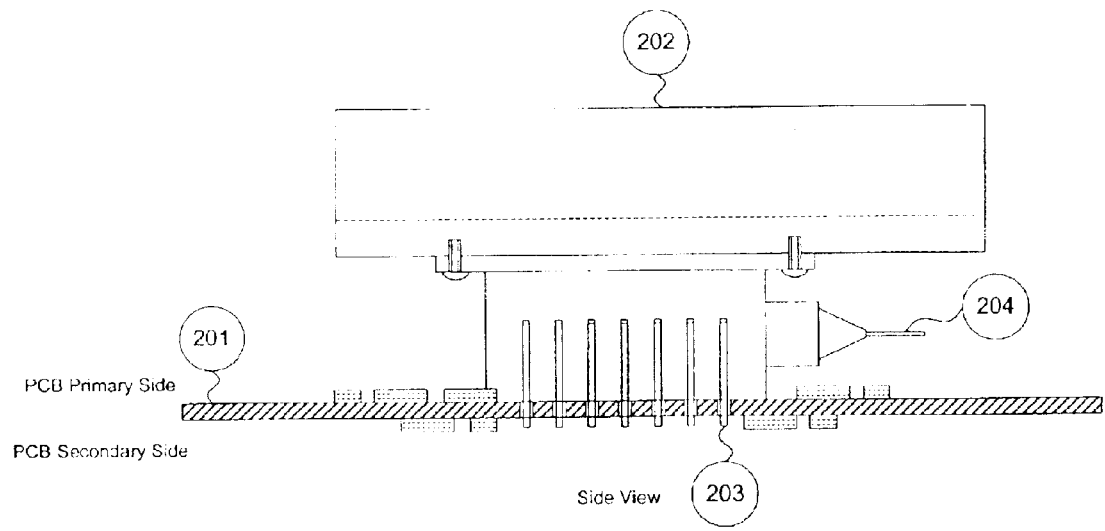
FIG. 2A is a side view of a prior art mounting technique with leads connected to through holes.
Figure 2B:
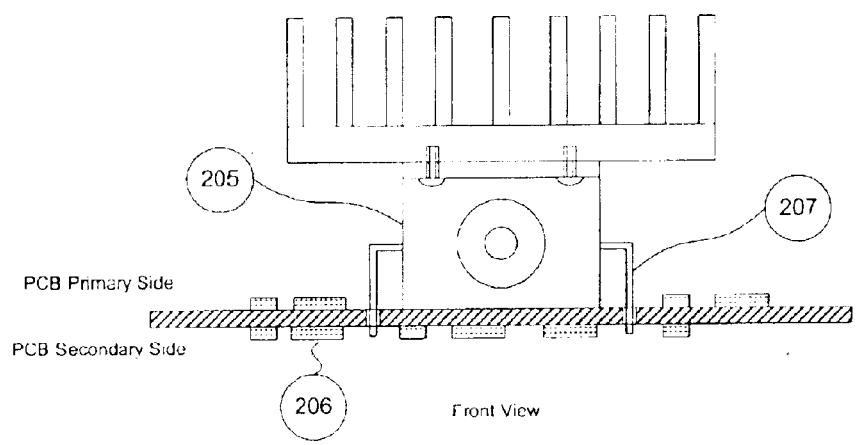
FIG. 2B is an end view of the technique shown in FIG. 2A.

FIGS. 2A and 2B show an alternate prior art Butterfly package mounting technique. In this Lead Forming method of mounting the Butterfly package 205, the leads 207 are bent 90 degrees and either mounted on surface mount pads or inserted through holes 203 into the PCB 201. Any required heatsinks 202 can be mounted on the primary side. The optical fiber 204, exits well above the PCB 201. Surface mount components 206 can be mounted near the Butterfly package 205 on both the primary and secondary side. The length of the leads 207, with its associated parasitic inductance makes this method unusable at high frequencies such as Gigahertz data rates.

Figure 3A:
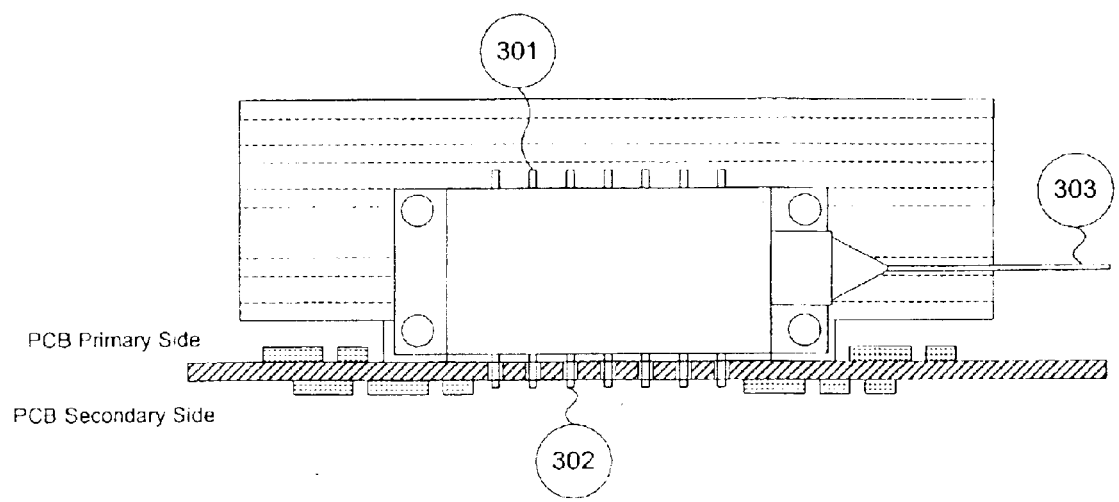
FIG. 3A is a side view of the mounting technique according to the present invention.
Figure 3B:
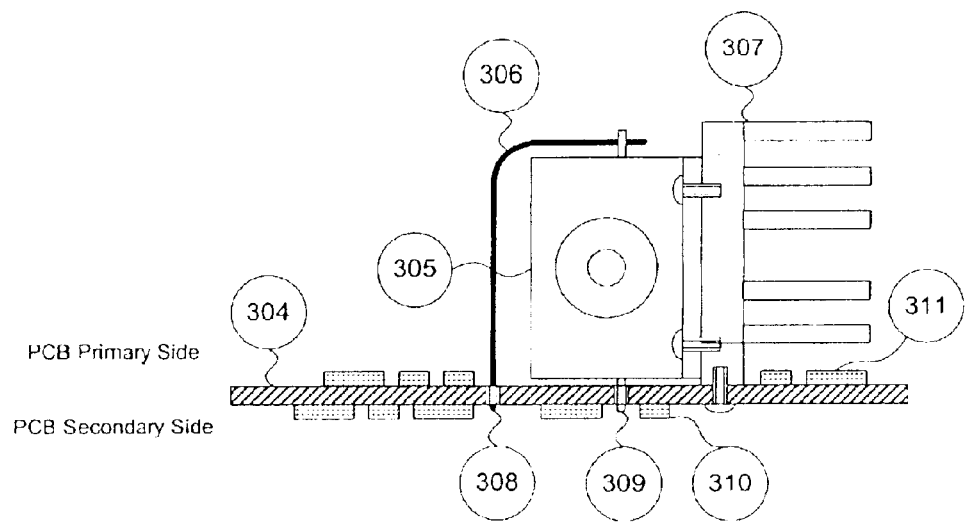
FIG. 3B is an end view of the mounting technique of FIG. 3A.

FIGS. 3A and 3B illustrate the method of mounting the Butterfly package according to the present invention wherein the package 305 is mounted on its side. The bottom row of pins 302 are mounted through holes in the PCB 304. The top row of pins 301 is connected to a flex circuit 306. The other end of the flex circuit is shown as mounted through holes 308 but could also be mounted to surface mount pads. Depending on the needed application, the through hole connections 308 and 309 can be designed to support DC currents or high frequency signals. Similarly the flex circuit 306 can be specifically designed to carry DC currents or high frequency signals. In the new mounting method, the optical fiber 303 is well above the PCB 304; so additional clearances are not required as in the conventional method of mounting. Any required heatsinks 307 can be mounted on the primary side of the PCB 304. Note that through careful design of the heatsink only a small amount of PCB area is lost. The cooling fins of the heatsink 307 can be raised above the PCB 304 resulting in useable layout space for surface mount components 310, 311. If desired, the Butterfly package 305 could be raised up above the PCB 304 to allow surface mount components 310 to be mounted on the primary side of the PCB 304 under the Butterfly package, however high frequency performance will be reduced.

Figure 4:
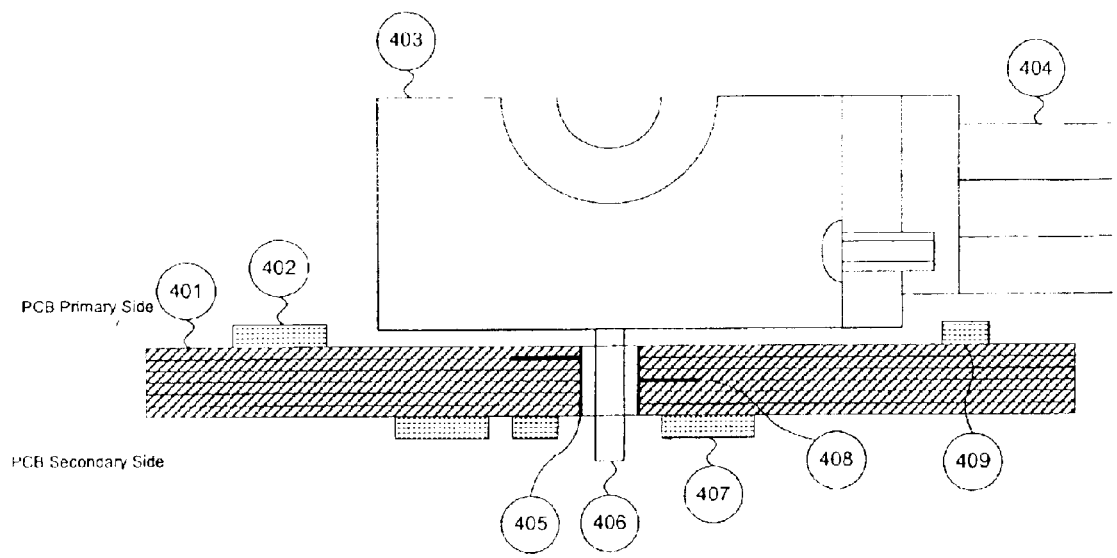
FIG. 4 is an enlarged view of the lead connection according to the mounting connection of FIG. 3A.

Refer to FIG. 4 for greater detail of the through hole mounting of FIGS. 3A and 3B. With good design, this invention increases the density of components 402, 407, 409 capable of being placed in close proximity to the point where an individual lead 406 exits the Butterfly package 403. Specifically the following advantages are gained The lead length which occupies the surface of the PCB 401 is restricted to the size of the hole 405 through which the lead 406 is mounted;

The attachment of the lead 406 to other internal layers 408 of the PCB 401, including the secondary side of the PCB, is accomplished by the same hole 405 through which the lead 406 is mounted;

Components 402, 409, mounted on the primary of the PCB can be mounted very close to the Butterfly package 403 outline Components 407, mounted on the secondary side of the PCB can be mounted very close to the lead 406 of the Butterfly package 403;

The distance to the secondary side components 407 may be reduced by reducing the thickness of the PCB 401 to reduce the lead length 406;

The component height allocation on the primary side of the board may now be more fully utilized by placement of the (relatively) bulky Butterfly package 403 in the air, along with any accompanying heatsink(s) 404, mechanical components, optical fiber and cable or wire connections etc.;

The flexible circuit may be used to carry electrical components above the main circuit board;

Although a particular embodiment of the invention has been described and illustrated it will be apparent to one skilled in the art that numerous changes can be made without departing from the basic concept. It is to be understood, however, that such changes will fall within the full scope of the invention as defined by the appended claims.

We claim:

1. A method of mounting a package to a printed circuit board (PCB), the package having a body with a plurality of leads extending outwardly from opposed first and second sides of the body, the method comprising:
   locating the package on the PCB such that leads on the first side of the body are directed toward the PCB;
   connecting the leads on the first side to connection points on the PCB; and
   connecting the leads on the second side of the body to a flexible ribbon connector, wherein the flexible ribbon connector is connected to through-holes in the PCB.

2. The method as defined in claim 1 wherein the package is a butterfly package for housing optical components.

3. The method as defined in claim 1 wherein the package is a butterfly package for housing electrical components.

4. The method as defined in claim 1 wherein a heatsink is attached to the package.

5. The method as defined in claim 4 wherein the package is in contact with the PCB.

6. The method as defined in claim 4 wherein the package is located above a primary surface of the PCB.

7. The method as defined in claim 5 wherein cooling fins for the heat sink are located above a primary surface of the PCB.

8. The method as defined in claim 1 wherein the leads on the first side of the package are connected to surface mount pads on the PCB.

9. The method as defined in claim 1 wherein the leads on the first side of the package are inserted through and connected to holes in the PCB. above a primary surface of the PCB.

10. The method as defined in claim 9 wherein the PCB is single layered and the leads are connected to metalized areas on at least one outer layer.

11. The method as defined in claim 9 wherein the PCB is multilayered and the leads are connected to metalized areas on at least one of an outer layer or internal layer.

12. A method of mounting butterfly packages, each having a body and multiple leads extending outwardly from opposite sides thereof, on a printed circuit board (PCB) to increase component density, the PCB having internal layers, the method comprising:
   attaching the multiple leads on the butterfly package to a first side of the PCB on which conducting paths have been formed on at least one of primary, secondary or internal layers;
   attaching a flexible ribbon connector, to the multiple leads on a second and opposite side of the butterfly package; and
   connecting the flexible ribbon connectors to through holes in the PCB.

13. The method as defined in claim 12 wherein the leads on said first side of the butterfly package are kept to a minimum length for high frequency applications.

14. The method as defined in claim 12 wherein a heat sink is attached to the butterfly package such that it is raised above the surface of the PCB.

15. The method as defined in claim 12 wherein leads on said first side of the Butterfly package are long enough to permit the package to be located above the PCB leaving clearance therebetween for other components.

* * * * *